United States Patent
Chou et al.

(10) Patent No.: US 10,732,658 B1
(45) Date of Patent: Aug. 4, 2020

(54) CORRECTION CONTROL MODULE FOR POWER FACTOR CORRECTION CIRCUIT

(71) Applicant: SEA SONIC ELECTRONICS CO., LTD., Taipei (TW)

(72) Inventors: Sheng-Chien Chou, Taipei (TW); Chih-Sheng Chang, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 16/585,450

(22) Filed: Sep. 27, 2019

(51) Int. Cl.
*G05F 1/70* (2006.01)
*H02M 1/42* (2007.01)
*G01R 21/06* (2006.01)
*G01R 21/00* (2006.01)
*G01R 19/00* (2006.01)

(52) U.S. Cl.
CPC ............ *G05F 1/70* (2013.01); *G01R 19/0053* (2013.01); *G01R 21/006* (2013.01); *G01R 21/06* (2013.01); *H02M 1/42* (2013.01); *H02M 1/4208* (2013.01)

(58) Field of Classification Search
CPC .......... G05F 1/70; H02M 1/42; H02M 1/4208
USPC ................. 323/275; 363/45, 46, 78
See application file for complete search history.

(56) References Cited

U.S. PATENT DOCUMENTS

| | | | | |
|---|---|---|---|---|
| 6,686,725 B1* | 2/2004 | Choi | .................. | G05F 1/70 323/207 |
| 7,638,966 B1* | 12/2009 | Pummer | .................. | G05F 1/70 318/438 |
| 9,954,445 B2* | 4/2018 | Gritti | ................ | H02M 3/33523 |
| 2007/0036212 A1* | 2/2007 | Leung | ................... | H02M 3/157 375/238 |
| 2015/0022163 A1* | 1/2015 | Han | ................... | H02M 1/4216 323/205 |
| 2015/0372588 A1* | 12/2015 | Jiang | ................... | H02M 1/4208 323/210 |
| 2017/0250620 A1* | 8/2017 | White, Jr. | ............... | H02M 1/42 |

FOREIGN PATENT DOCUMENTS

| CN | 1753290 B | 4/2010 |
|---|---|---|
| TW | I459696 B | 11/2014 |
| TW | I466428 B | 12/2014 |
| TW | I590574 B | 7/2017 |

\* cited by examiner

*Primary Examiner* — Gary A Nash
(74) *Attorney, Agent, or Firm* — Muncy, Geissler, Olds & Lowe, P.C.

(57) ABSTRACT

A correction control module for a power factor correction circuit comprises a current sampling unit, an adjustment unit and a control unit. The current sampling unit generates a sampling current based on the operation of a power factor correction circuit. The adjustment unit is connected to the current sampling unit and receives the sampling current. The adjustment unit is composed of a fixed resistance branch and a variable resistance branch connected in parallel with the fixed resistance branch, and the variable resistance and fixed resistance branches receive the sampling current to generate a node voltage. The control unit controls a resistance of the variable resistance branch based on an input voltage and an output voltage of the power factor correction circuit. Thus, an equivalent resistance of the variable resistance branch and the fixed resistance branch is changed according to an operating state of the power factor correction circuit.

10 Claims, 6 Drawing Sheets

CORRECTION CONTROL MODULE FOR POWER FACTOR CORRECTION CIRCUIT

FIELD OF THE INVENTION

The present invention relates to a correction control module for a power factor correction circuit.

BACKGROUND OF THE INVENTION

Nowadays, the control of power factor correction circuit is mainly performed by a correction control module, as mentioned in patents TW I459696, TW I466428, TW I590574, and CN1753290. Power factor adjustment by the correction control module is mainly based on an input voltage, an output voltage and an operating current of the power factor correction circuit. However, since the input voltage of the power factor correction circuit used by a power supplier is as high as 380 V, the operating current of the power factor correction circuit is small. The circuit mode of the existing correction control module is unable to properly adjust when the operating current becomes small, so that the control of the power factor and current harmonic distortion cannot be effectively improved.

SUMMARY OF THE INVENTION

A main object of the present invention is to solve the problem that the conventional correction control module is unable to effectively improve the power factor and current harmonic distortion by adjusting circuit parameters according to the current.

In order to achieve the above object, the present invention provides a correction control module for a power factor correction circuit comprising a current sampling unit, an adjustment unit and a control unit. The current sampling unit generates a sampling current based on the operation of a power factor correction circuit. The adjustment unit is connected to the current sampling unit and receives the sampling current. The adjustment unit is composed of a fixed resistance branch and a variable resistance branch connected in parallel with the fixed resistance branch. The variable resistance branch comprises a first field-effect transistor, and the variable resistance branch and the fixed resistance branch receive the sampling current to generate a node voltage. The control unit is connected to the power factor correction circuit and the adjustment unit to obtain the node voltage, an input voltage, and an output voltage. The control unit generates a control signal based on the input voltage and the output voltage, and the control signal is output to a gate of the first field-effect transistor, causing the first field-effect transistor to operate in a linear mode to change an equivalent resistance of the variable resistance branch and the fixed resistance branch, so that the node voltage is not affected by high or low levels of the input voltage.

In one embodiment, the control unit comprises a node voltage input end and a reference potential connection end, one of a plurality of parallel nodes of the variable resistance branch and the fixed resistance branch is connected to the node voltage input end, and the other parallel node is connected to the reference potential connection end.

In one embodiment, the variable resistance branch comprises a first resistor connected in series with the first field-effect transistor, and the fixed resistance branch comprises at least one second resistor.

In one embodiment, the power factor correction circuit comprises an input capacitor, the current sampling unit comprises at least one third resistor connected to a negative pole of the input capacitor, and an operational amplifier. The operational amplifier comprises a positive input end connected to one end of the third resistor that is not connected to the input capacitor, a negative input end connected to the third resistor and the negative pole of the input capacitor, and an output end connected to the adjustment unit.

In one embodiment, the power factor correction circuit comprises a second field-effect transistor, the current sampling unit comprises a first current comparator and a first diode, and the first current comparator comprises a first winding connected in series with a drain of the second field-effect transistor, and a second winding magnetically coupled to the first winding and connected to the first diode.

In one embodiment, the power factor correction circuit comprises an output capacitor, and a second diode connected to the output capacitor. A negative pole of the second diode is connected to a positive pole of the output capacitor. The current sampling unit comprises a second current comparator and a third diode. The second current comparator comprises a third winding connected in series with a positive pole of the second diode, and a fourth winding magnetically coupled to the third winding and connected to the third diode.

According to the foregoing disclosure of the present invention, the present invention has the following features as compared with the prior art: the first field-effect transistor of the present invention changes resistance according to the control of the control signal, so that a resistance of the variable resistance branch is changed, and the equivalent resistance of the variable resistance branch and the fixed resistance branch is changed. Also, when a high voltage is input into the correction control module from the power factor correction circuit, the correction control module is capable of preventing current harmonic distortion from being generated since the node voltage is not affected even though the sampling current is decreased. Therefore, power factor correction of the power factor correction circuit is optimized.

DETAILED DESCRIPTION OF THE PREFERRED EMBODIMENTS

The detailed description and technical content of the present invention is described with reference to the accompanying drawings as follows.

Figure 1:
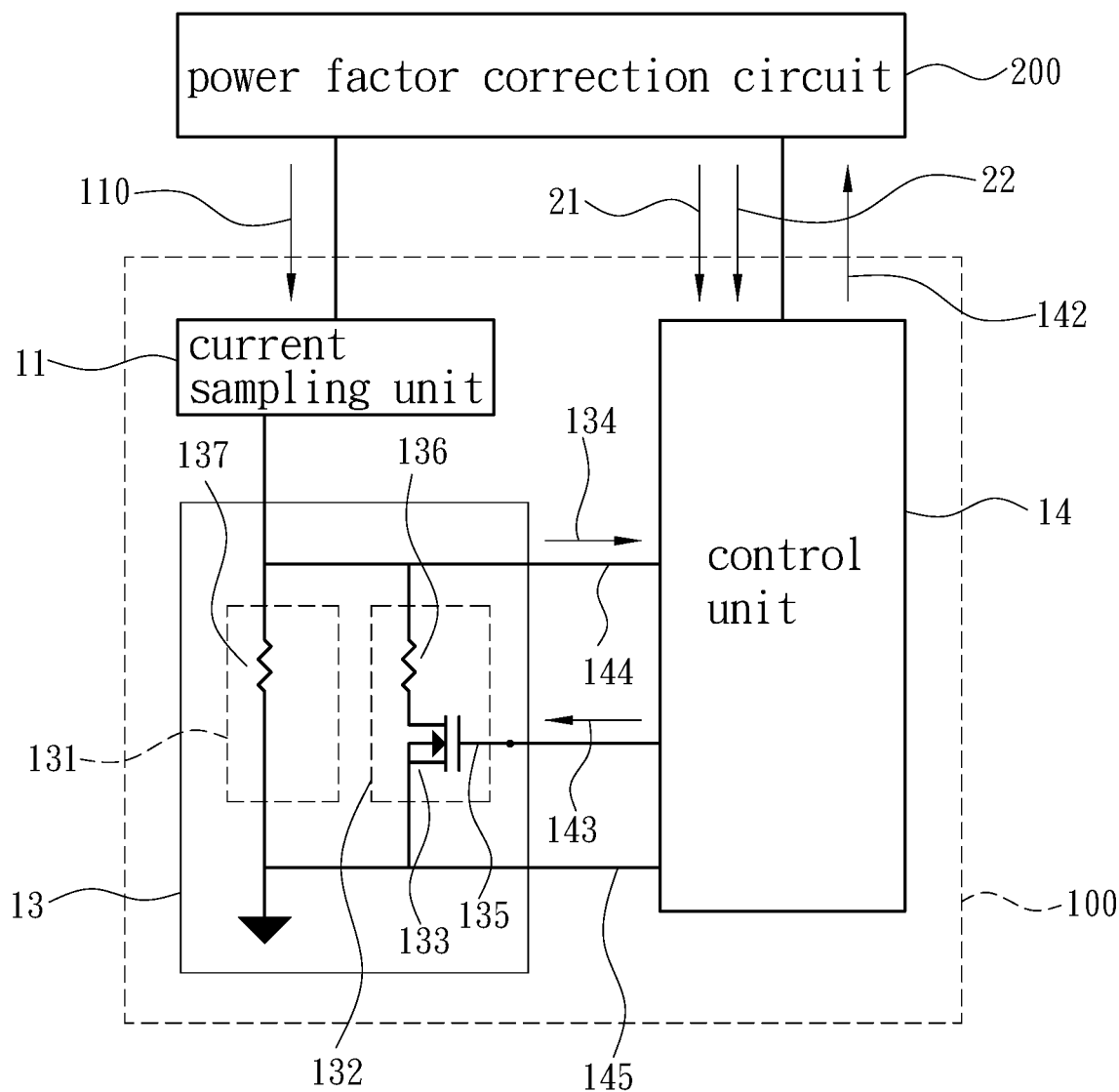
FIG. 1 is a schematic view of the composition of an embodiment of the present invention.
Figure 2:
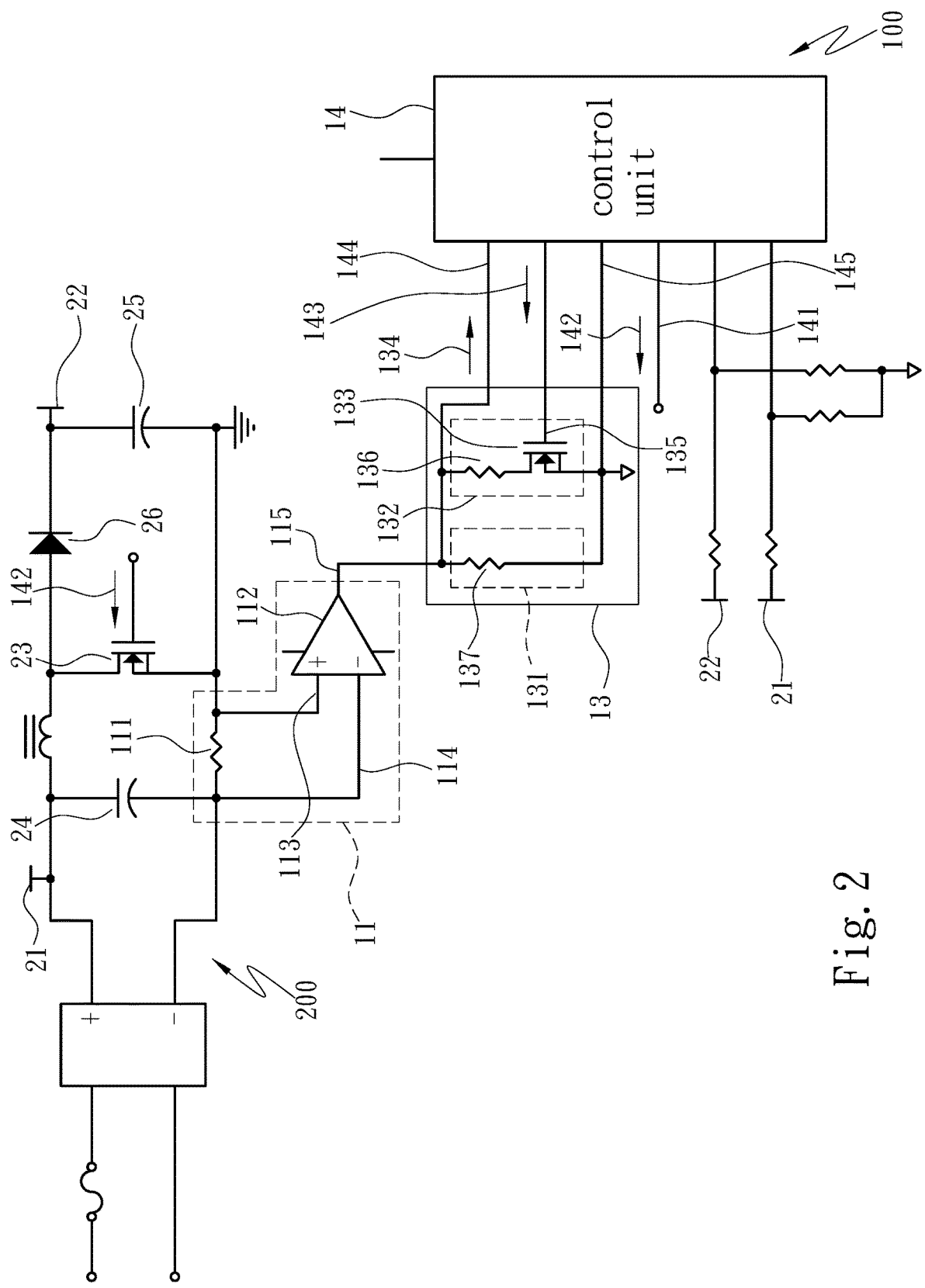
FIG. 2 is a circuit diagram of an embodiment of the present invention.

Please refer to FIG. 1 and FIG. 2, the present invention provides a correction control module 100, and the correction control module 100 controls the operation of a power factor correction circuit 200 based on a feedback message of the power factor correction circuit 200. Also, the power factor correction circuit 200 may be disposed in a power supply module which is well known to those skilled in the art, thus details are not described herein. The correction control module 100 comprises a current sampling unit 11, an adjustment unit 13, and a control unit 14. The current sampling unit 11 is connected to the power factor correction circuit 200, and the current sampling unit 11 captures one of a plurality of branch currents (not shown in the drawings) of the power factor correction circuit 200 to be used as a sampling current 110. The adjustment unit 13 is connected to the current sampling unit 11 and receives the sampling current 110. Further, the adjustment unit 13 is composed of a fixed resistance branch 131 and a variable resistance branch 132 connected in parallel with the fixed resistance branch 131. The variable resistance branch 132 comprises a first field-effect transistor 133. Moreover, the variable resistance branch 132 and the fixed resistance branch 131 generate an equivalent resistance, and thus a node voltage 134 is generated at one of a plurality of parallel nodes after the variable resistance branch 132 and the fixed resistance branch 131 receive the sampling current 110.

On the other hand, the control unit 14 is implemented by an integrated circuit (IC), and the control unit 14 is connected to the power factor correction circuit 200 and the adjustment unit 13 to obtain the node voltage 134, an input voltage 21, and an output voltage 22. Also, the control unit 14 is directly connected to an input point and an output point of the power factor correction circuit 200 to obtain the input voltage 21 and the output voltage 22. Moreover, by using the node voltage 134 as a control reference, the control unit 14 provides a pulse width modulation signal 142 (i.e. PWM signal) to a second field-effect transistor 23 of the power factor correction circuit 200 through a control signal output end 141. Thus, the control unit 14 is able to adjust power factor actively. In addition, the control unit 14 of the present invention generates a control signal 143 based on the input voltage 21 and the output voltage 22, and the control signal 143 is a signal generated by pulse width modulation technique. However, an object being controlled by the control signal 143 is different from that being controlled by the pulse width modulation signal 142. Specifically, the first field-effect transistor 133 is controlled by the control signal 143, and the second field-effect transistor 23 is controlled by the pulse width modulation signal 142.

The control signal 143 is output to a gate 135 of the first field-effect transistor 133. The first field-effect transistor 133 is controlled by the control signal 143 to operate in a linear mode (or ohm mode). Resistance of the first field-effect transistor 133 is changed according to the control of the control signal 143, thereby causing a change in a resistance of the variable resistance branch 132. Thus, the equivalent resistance of the variable resistance branch 132 and the fixed resistance branch 131 is changed. Also, when a high voltage is input into the correction control module 100 from the power factor correction circuit 200, the correction control module 100 is capable of preventing current harmonic distortion from being generated since the node voltage 134 is not affected even though the sampling current 110 is decreased. Therefore, power factor correction of the power factor correction circuit 200 is optimized.

Please refer to FIG. 1 and FIG. 2, in one embodiment, the control unit 14 comprises a node voltage input end 144 and a reference potential connection end 145. One of the plurality of parallel nodes of the variable resistance branch 132 and the fixed resistance branch 131 is connected to the node voltage input end 144, and the other parallel node is connected to the reference potential connection end 145. In addition, in one embodiment, the variable resistance branch 132 comprises a first resistor 136 connected in series with the first field-effect transistor 133, and the fixed resistance branch 131 comprises at least one second resistor 137. The first resistor 136 and the second resistor 137 are both components with fixed resistance.

Figure 3:
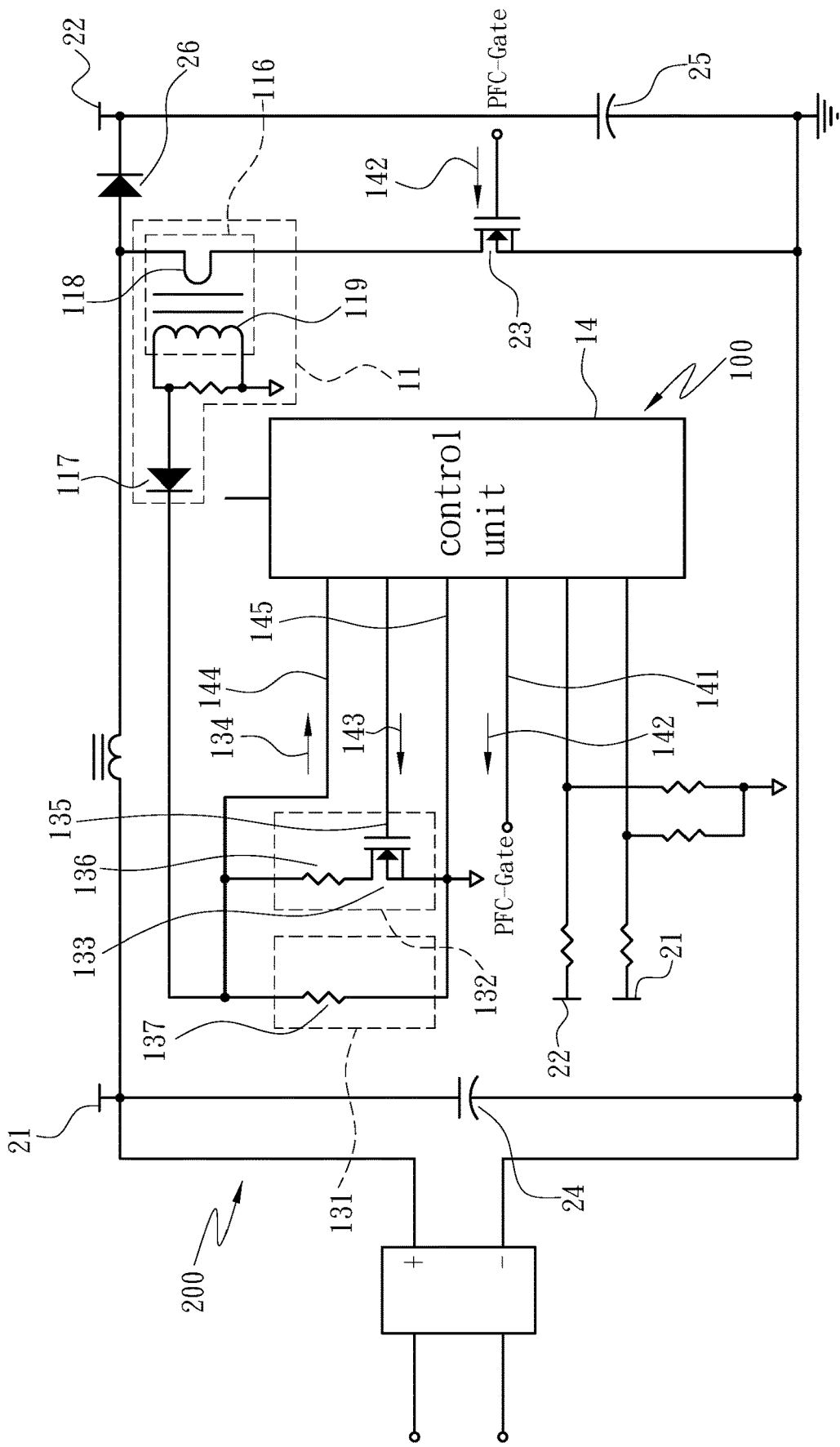
FIG. 3 is a first circuit diagram of another embodiment of the present invention.
Figure 4:
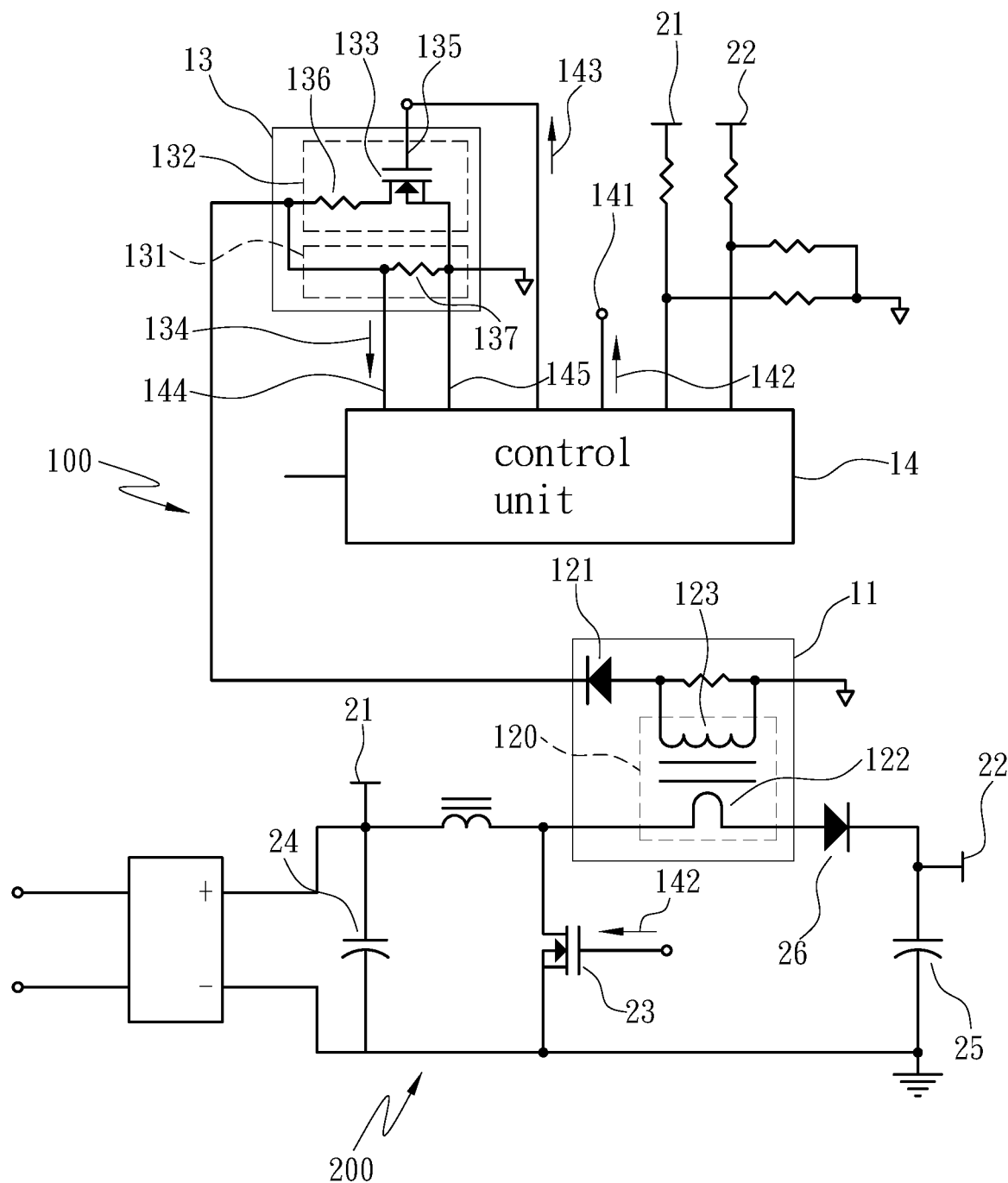
FIG. 4 is a second circuit diagram of another embodiment of the present invention.
Figure 5:
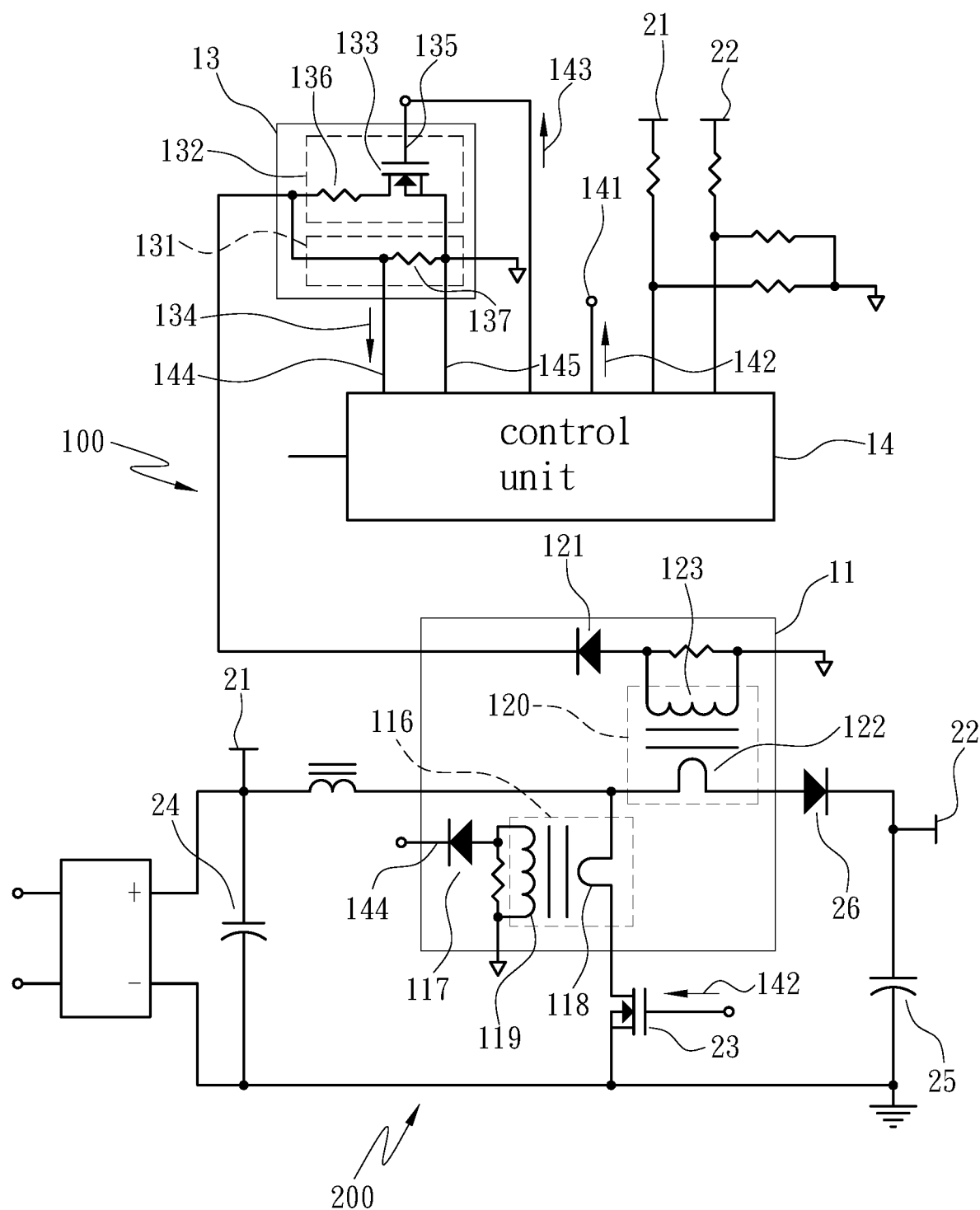
FIG. 5 is a third circuit diagram of another embodiment of the present invention.

Please refer to FIG. 2, the implementation structure of one embodiment of the current sampling unit 11 is described herein. The power factor correction circuit 200 comprises an input capacitor 24. The current sampling unit 11 comprises at least one third resistor 111 connected to a negative pole of the input capacitor 24, and an operational amplifier 112. The operational amplifier 112 comprises a positive input end 113 connected to one end of the third resistor 111 that is not connected to the input capacitor 24, a negative input end 114 connected to the third resistor 111 and the negative pole of the input capacitor 24, and an output end 115 connected to the adjustment unit 13. The operation principles of the operational amplifier 112 are well known to those skilled in the art and then are not described herein. Moreover, the current sampling unit 11 of the present invention is not limited to the foregoing. Please refer to FIG. 3, in another embodiment, the current sampling unit 11 comprises a first current comparator 116 and a first diode 117. The first current comparator 116 comprises a first winding 118 connected in series with a drain of the second field-effect transistor 23, and a second winding 119 magnetically coupled to the first winding 118 and connected to the first diode 117. Please refer to FIG. 4, in one embodiment, the power factor correction circuit 200 comprises an output capacitor 25, and a second diode 26 connected to the output capacitor 25. A negative pole of the second diode 26 is connected to a positive pole of the output capacitor 25. The current sampling unit 11 comprises a second current comparator 120 and a third diode 121. The second current comparator 120 comprises a third winding 122 connected in series with a positive pole of the second diode 26, and a fourth winding 123 magnetically coupled to the third winding 122 and connected to the third diode 121. Furthermore, as shown in FIG. 5, the circuits shown in FIG. 3 and FIG. 4 of the present invention may be implemented together. Thus, the control unit 14 does not need to perform the mechanism of program algorithm.

Figure 6:
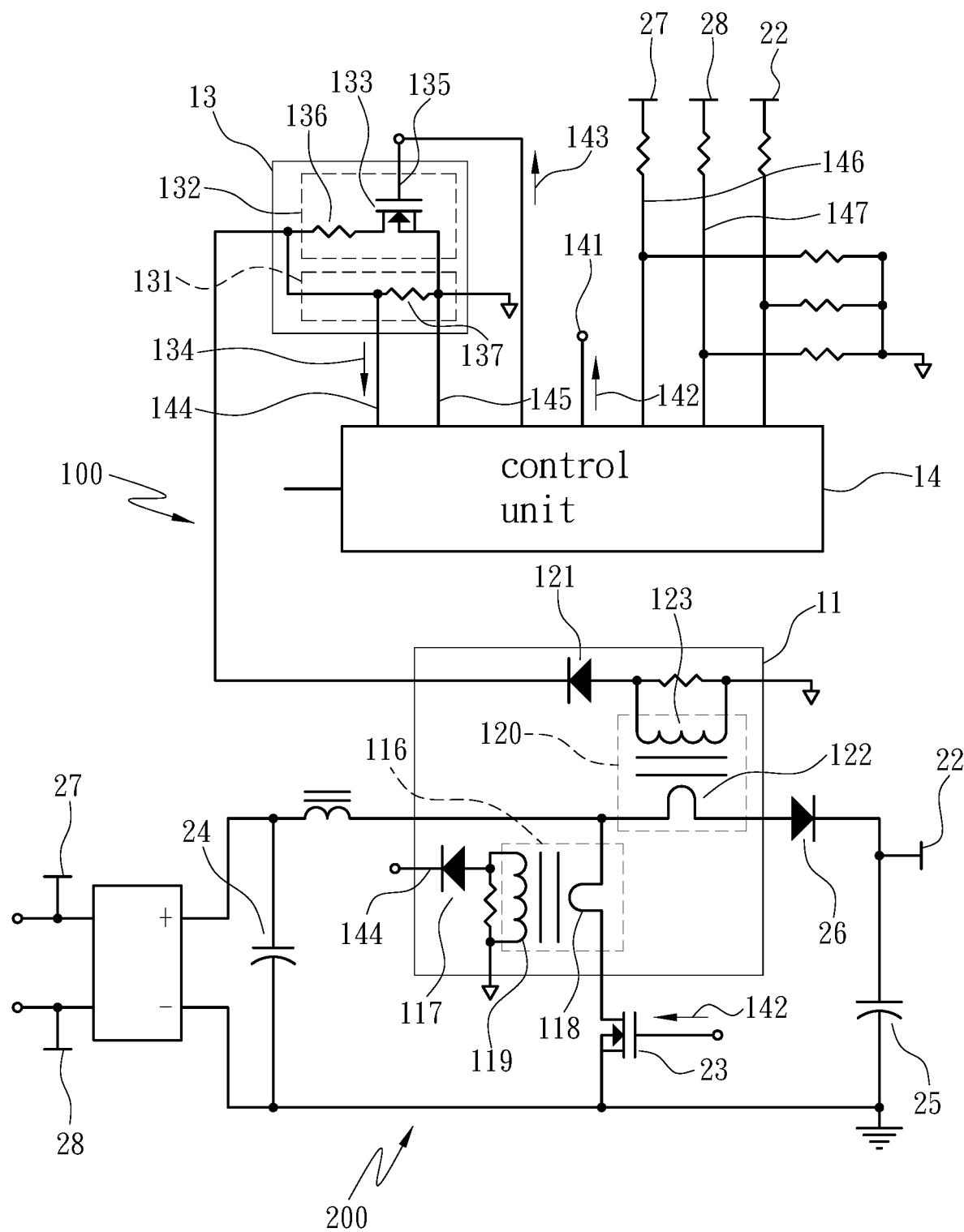
FIG. 6 is a fourth circuit diagram of another embodiment of the present invention.

Moreover, the input voltage 21 mentioned above is regarded as the voltage which is input by the power factor correction circuit 200. In addition, please refer to FIG. 6. In one embodiment, the input voltage 21 may be a voltage that the power supply module receives from the mains electricity and inputs the mains electricity into the subsequent circuit. Capture point can refer to a first voltage capture point 27 and a second voltage capture point 28 depicted in FIG. 6, and the control unit 14 comprises two input ends 146, 147 respectively connected to the first voltage capture point 27 and the second voltage capture point 28.

What is claimed is:

1. A correction control module for a power factor correction circuit, comprising:
   a current sampling unit, generating a sampling current based on an operation of a power factor correction circuit;
   an adjustment unit, connected to the current sampling unit and receiving the sampling current, the adjustment unit being composed of a fixed resistance branch and a variable resistance branch connected in parallel with the fixed resistance branch, the variable resistance branch comprising a first field-effect transistor, and the variable resistance branch and the fixed resistance branch receiving the sampling current to generate a node voltage; and a control unit, connected to the power factor correction circuit and the adjustment unit to obtain the node voltage, an input voltage, and an output voltage, the control unit generating a control signal based on the input voltage and the output voltage, the control signal being output to a gate of the first field-effect transistor, causing the first field-effect transistor to operate in a linear mode to change an equivalent resistance of the variable resistance branch and the fixed resistance branch, so that the node voltage being not affected by high or low levels of the input voltage.

2. The correction control module for the power factor correction circuit as claimed in claim 1, wherein the control unit comprises a node voltage input end and a reference potential connection end, one of a plurality of parallel nodes of the variable resistance branch and the fixed resistance branch is connected to the node voltage input end, and the other parallel node is connected to the reference potential connection end.

3. The correction control module for the power factor correction circuit as claimed in claim 1, wherein the variable resistance branch comprises a first resistor connected in series with the first field-effect transistor, and the fixed resistance branch comprises at least one second resistor.

4. The correction control module for the power factor correction circuit as claimed in claim 3, wherein the power factor correction circuit comprises an input capacitor, the current sampling unit comprises at least one third resistor connected to a negative pole of the input capacitor, and an operational amplifier, the operational amplifier comprises a positive input end connected to one end of the third resistor that is not connected to the input capacitor, a negative input end connected to the third resistor and the negative pole of the input capacitor, and an output end connected to the adjustment unit.

5. The correction control module for the power factor correction circuit as claimed in claim 3, wherein the power factor correction circuit comprises a second field-effect transistor, the current sampling unit comprises a first current comparator and a first diode, and the first current comparator comprises a first winding connected in series with a drain of the second field-effect transistor, and a second winding magnetically coupled to the first winding and connected to the first diode.

6. The correction control module for the power factor correction circuit as claimed in claim 5, wherein the power factor correction circuit comprises an output capacitor, and a second diode connected to the output capacitor, a negative pole of the second diode is connected to a positive pole of the output capacitor, the current sampling unit comprises a second current comparator and a third diode, the second current comparator comprises a third winding connected in series with a positive pole of the second diode, and a fourth winding magnetically coupled to the third winding and connected to the third diode.

7. The correction control module for the power factor correction circuit as claimed in claim 3, wherein the power factor correction circuit comprises an output capacitor, and a second diode connected to the output capacitor, a negative pole of the second diode is connected to a positive pole of the output capacitor, the current sampling unit comprises a second current comparator and a third diode, the second current comparator comprises a third winding connected in series with a positive pole of the second diode, and a fourth winding magnetically coupled to the third winding and connected to the third diode.

8. The correction control module for the power factor correction circuit as claimed in claim 1, wherein the power factor correction circuit comprises an input capacitor, the current sampling unit comprises at least one third resistor connected to a negative pole of the input capacitor, and an operational amplifier, the operational amplifier comprises a positive input end connected to one end of the third resistor that is not connected to the input capacitor, a negative input end connected to the third resistor and the negative pole of the input capacitor, and an output end connected to the adjustment unit.

9. The correction control module for the power factor correction circuit as claimed in claim 1, wherein the power factor correction circuit comprises a second field-effect transistor, the current sampling unit comprises a first current comparator and a first diode, and the first current comparator comprises a first winding connected in series with a drain of the second field-effect transistor, and a second winding magnetically coupled to the first winding and connected to the first diode.

10. The correction control module for the power factor correction circuit as claimed in claim 9, wherein the power factor correction circuit comprises an output capacitor, and a second diode connected to the output capacitor, a negative pole of the second diode is connected to a positive pole of the output capacitor, the current sampling unit comprises a second current comparator and a third diode, the second current comparator comprises a third winding connected in series with a positive pole of the second diode, and a fourth winding magnetically coupled to the third winding and connected to the third diode.

* * * * *